US012610539B2

(12) United States Patent

Hua et al.

(10) Patent No.: US 12,610,539 B2

(45) Date of Patent: Apr. 21, 2026

(54) SEMICONDUCTOR STRUCTURE AND METHOD FOR FORMING SEMICONDUCTOR STRUCTURE

(71) Applicant: ICLEAGUE TECHNOLOGY CO., LTD., Jiaxing (CN)

(72) Inventors: Wenyu Hua, Jiaxing (CN); Fandong Liu, Jiaxing (CN); Xiao Ding, Jiaxing (CN)

(73) Assignee: ICLEAGUE TECHNOLOGY CO., LTD., Jiaxing (CN)

( * ) Notice: Subject to any disclaimer, the term of this patent is extended or adjusted under 35 U.S.C. 154(b) by 343 days.

(21) Appl. No.: 18/574,057

(22) PCT Filed: Sep. 2, 2021

(86) PCT No.: PCT/CN2021/116126

§ 371 (c)(1),
(2) Date: Dec. 25, 2023

(87) PCT Pub. No.: WO2023/279505

PCT Pub. Date: Jan. 12, 2023

(65) Prior Publication Data

US 2024/0292606 A1 Aug. 29, 2024

(30) Foreign Application Priority Data

Jul. 7, 2021 (CN) .......................... 202110769215.X

(51) Int. Cl.
H10B 12/00 (2023.01)

(52) U.S. Cl.
CPC ......... H10B 12/488 (2023.02); H10B 12/038 (2023.02); H10B 12/315 (2023.02); H10B 12/482 (2023.02)

(58) Field of Classification Search
CPC .. H10B 12/488; H10B 12/038; H10B 12/315; H10B 12/482; H10B 12/033; H10B 12/053; H10B 12/34; H10B 12/0335
See application file for complete search history.

(56) References Cited

U.S. PATENT DOCUMENTS 11,430,792 B2 * 8/2022 Jen ......................... H10B 12/01
2001/0054719 A1 12/2001 Ahn et al.
(Continued)

FOREIGN PATENT DOCUMENTS

CN 110137138 A 8/2019
CN 112864158 A 5/2021
(Continued)

OTHER PUBLICATIONS

International Search Report for PCT/CN2021/116126 mailed Apr. 13, 2022, ISA/CN.
(Continued)

*Primary Examiner* — Douglas W Owens
(74) *Attorney, Agent, or Firm* — Yue (Robert) Xu; Apex Attorneys at Law, LLP

(57) ABSTRACT

A semiconductor structure and a formation method therefor. The semiconductor structure comprises: a substrate, which has opposite first and second surfaces, and comprises several discrete active areas arranged in a first direction and parallel to a second direction, wherein the first direction is perpendicular to the second direction; word line gate structures, which are disposed in the active areas, extend from the first surface to the second surface, are arranged in the second direction, and run through the active areas along the first direction; a first isolation structure, which is disposed in the substrate and extends from the second surface to the first surface; bit line structures, which are disposed on the first surface, electrically coupled with the active areas, arranged in the first direction, and parallel to the second direction; and (Continued)

capacitor structures, which are disposed on the second surface and electrically coupled with the active areas.

20 Claims, 13 Drawing Sheets

(56)                References Cited

U.S. PATENT DOCUMENTS

| | | | |
|---|---|---|---|
| 2007/0152255 A1 | 7/2007 | Seo et al. | |
| 2009/0008691 A1* | 1/2009 | Lee | H10D 64/513 |
| | | | 257/301 |
| 2009/0152611 A1 | 6/2009 | Fujimoto | |
| 2013/0001675 A1 | 1/2013 | Chung et al. | |
| 2013/0015551 A1* | 1/2013 | Wang | H10B 12/48 |
| | | | 257/E27.07 |
| 2013/0161832 A1 | 6/2013 | Cho et al. | |
| 2014/0042548 A1* | 2/2014 | Liu | H10B 12/00 |
| | | | 257/368 |
| 2021/0327882 A1* | 10/2021 | Liao | H10B 12/482 |
| 2022/0157824 A1* | 5/2022 | Lu | G11C 5/063 |
| 2022/0189968 A1* | 6/2022 | Park | H10B 12/053 |
| 2022/0302123 A1* | 9/2022 | Munetaka | H10D 64/667 |
| 2023/0032102 A1* | 2/2023 | Mei | H10B 12/34 |
| 2023/0053627 A1* | 2/2023 | Lu | H10D 62/102 |
| 2023/0115307 A1* | 4/2023 | Lu | H10B 12/488 |
| | | | 257/295 |

FOREIGN PATENT DOCUMENTS

| | | |
|---|---|---|
| CN | 112951828 A | 6/2021 |
| CN | 112951829 A | 6/2021 |
| KR | 20070052653 A | 5/2007 |
| KR | 20130007236 A | 1/2013 |
| KR | 20130074237 A | 7/2013 |

OTHER PUBLICATIONS

Korean First Office Action issued on Jan. 20, 2025 for the Korean counterpart application No. 10-2024-7004589.
Korean second Office Action issued on Aug. 5, 2025 for Korean counterpart application No. 10-2024-7004589.

* cited by examiner

SEMICONDUCTOR STRUCTURE AND METHOD FOR FORMING SEMICONDUCTOR STRUCTURE

CROSS-REFERENCE TO RELATED APPLICATIONS

This application is the national phase of International Application No. PCT/CN2021/116126, filed on Sep. 2, 2021, which claims the benefit of priority to Chinese Patent Application No. 202110769215.X, filed on Jul. 7, 2021 with China National Intellectual Property Administration, and entitled "SEMICONDUCTOR STRUCTURE AND METHOD FOR FORMING SEMICONDUCTOR STRUCTURE", the entire disclosure of which is incorporated herein by reference.

TECHNICAL FIELD

The present disclosure relates to the field of semiconductor manufacturing, and particularly, to a semiconductor structure and a method for forming the same.

BACKGROUND

Dynamic random access memory (simply, DRAM) is a type of semiconductor memory working mainly in such a way that the amount of charges stored in a capacitor is used to represent whether a binary bit is 1 or 0.

In addition, dynamic random access memory (DRAM) has a basic memory cell consisting of a transistor and a memory capacitor; and a memory array consisting of a plurality of the memory cells. Thus, area size of the basic memory cell may greatly influence chip area size of the memory.

However, structures of the existing DRAMs need to be improved.

SUMMARY

The present disclosure provides a semiconductor structure and a method for forming the same to increase integration level of a dynamic random access memory.

Embodiments of the present disclosure provide a semiconductor structure, which includes a substrate, which has a first surface and a second surface opposite to the first surface, and includes several discrete active areas arranged in a first direction and parallel to a second direction, wherein the first direction is perpendicular to the second direction; a plurality of word line gate structures, which are disposed in and adjacent to the active areas, extend from the first surface to the second surface, are arranged in the second direction, and run through the active areas along the first direction; a first isolation structure, which is disposed in the substrate and extends from the second surface of the substrate to the first surface of the substrate, wherein the word line gate structures are disposed on two sides of the first isolation structure; a plurality of bit line structures, which are disposed on the first surface of the substrate, electrically coupled with the active areas, arranged in the first direction, and parallel to the second direction; and a plurality of capacitor structures, which are disposed on the second surface of the substrate and electrically coupled with the active areas.

Optionally, the semiconductor structure further includes a plurality of first doped regions, which are disposed in the active areas on the first surface of the substrate, and each of the plurality of bit line structures is electrically coupled with a row of first doped regions arranged in the second direction, respectively.

Optionally, the semiconductor structure further includes a plurality of second doped regions, which are disposed in the active areas on the second surface of the substrate, and have depths greater than or equal to a distance between the plurality of word line gate structures and the second surface of the substrate; and each of the plurality of capacitor structures is electrically coupled with the second doped region(s) in one of the active areas, respectively.

Optionally, the plurality of capacitor structures have projection on the second surface of the substrate overlapping with at least part of the second doped regions.

Optionally, a second isolation structure is disposed between adjacent active areas, and the second surface of the substrate exposes the second isolation structure.

Optionally, the semiconductor structure further includes a third isolation structure, which is disposed in the active areas between adjacent word line gate structures, extends from the second surface to the first surface of the substrate, and has a depth in the substrate greater than the thicknesses of the second doped regions.

Optionally, the plurality of word line gate structures include a gate dielectric layer and a gate layer disposed on a surface of the gate dielectric layer.

Optionally, the gate layer is made of a material including polycrystalline silicon or a metal, wherein the metal includes tungsten.

Optionally, the gate layer includes a first part and a second part disposed on the first part, and the first part and the second part are made of different materials.

Optionally, the first part is made of a material including polycrystalline silicon or a metal, wherein the metal includes tungsten; and the second part is made of a material including polycrystalline silicon or a metal, wherein the metal includes tungsten.

Correspondingly, the embodiments of the present disclosure further provide a method for forming a semiconductor structure, which includes providing a substrate, which has a first surface and a second surface opposite to the first surface, and includes several discrete active areas arranged in a first direction and parallel to a second direction, wherein the first direction is perpendicular to the second direction; forming in the substrate a plurality of first trenches, which extend from the first surface to the second surface, arranged in the second direction, and run through the active areas along the first direction; forming an initial word line gate structure in the first trenches; after the initial word line gate structure is formed, forming on the first surface of the substrate a plurality of bit line structures, which are arranged in the first direction and parallel to the second direction; after the plurality of bit line structures are formed, removing a part of the substrate and a part of the initial word line gate structure, so as to form in the substrate a second trench that extends from the second surface of the substrate to the first surface of the substrate and runs through the initial word line gate structure, so that the initial word line gate structure forms discrete word line gate structures; forming a first isolation structure in the second trench, wherein the word line gate structures are disposed on two sides of the first isolation structure; after the first isolation structure is formed, forming on the second surface of the substrate a plurality of capacitor structures, which are electrically coupled with the active areas.

Optionally, a second isolation structure is disposed between adjacent active areas, and a method for removing a part of the substrate and a part of the initial word line gate structure includes thinning the substrate from the second surface, until a surface of the second isolation structure is exposed; and removing a part of thinned substrate and a part of the initial word line gate structure, to form the second trench and the word line gate structures.

Optionally, a method for forming the plurality of bit line structures includes forming a first dielectric layer on the initial word line gate structure and the first surface of the substrate; forming in the first dielectric layer a third trench, which exposes a partial surface of the active areas; and forming the plurality of bit line structures in the third trench.

Optionally, before forming the plurality of bit line structures on the first surface of the substrate, the method for forming a semiconductor structure further includes implanting an ion into a surface of the active areas exposed on the first surface of the substrate, so as to form a plurality of first doped regions in the active areas; and electrically coupling each of the bit line structures with a row of first doped regions arranged in the second direction.

Optionally, the word line gate structures have a top surface, which is facing the first surface of the substrate and higher than the bottom plane of the first doped regions facing the first surface of the substrate.

Optionally, a method for forming the plurality of capacitor structures includes forming on the active areas and the second isolation structure on the second surface of the substrate a second dielectric layer, which has a plurality of fourth trenches therein exposing a surface of the active areas; and forming the plurality of capacitor structures in the plurality of fourth trenches.

Optionally, after the first isolation structure is formed in the second trench and before the plurality of capacitor structures are formed on the second surface of the substrate, the method for forming a semiconductor structure further includes implanting an ion into the second surface of the thinned substrate, so as to form a plurality of second doped regions in the active areas; and electrically coupling each of the plurality of capacitor structures with the second doped region(s) in one of the active areas, respectively.

Optionally, the plurality of capacitor structures have projection on the second surface of the substrate overlapping with at least part of the second doped regions.

Optionally, while removing a part of the thinned substrate and a part of the initial word line gate structure, the method for forming a semiconductor structure further includes removing a part of the active areas between adjacent first trenches, so as to form in the substrate a fifth trench, which extends from the second surface to the first surface of the substrate and has a depth in the substrate greater than thicknesses of the second doped regions.

Optionally, while forming the first isolation structure in the second trench, the method for forming a semiconductor structure further includes forming a third isolation structure in the fifth trench.

Optionally, the initial word line gate structure includes a gate dielectric layer disposed on side wall and bottom surfaces of the first trenches, and a gate layer disposed on a surface of the gate dielectric layer.

Optionally, the gate layer is made of a material including polycrystalline silicon or a metal, wherein the metal includes tungsten.

Optionally, the gate layer includes a first part disposed at the bottom of the first trenches and a second part disposed on the first part, and the first part and the second part are made of different materials.

Optionally, the first part is made of a material including polycrystalline silicon or a metal, wherein the metal includes tungsten; and the second part is made of a material including polycrystalline silicon or a metal, wherein the metal includes tungsten.

The embodiments of the present disclosure have the following beneficial effects.

In the semiconductor structure according to the embodiments of the present disclosure, in one aspect, the capacitor structures are disposed on the second surface of the substrate, and the bit line structures are disposed on the first surface of the substrate, thereby greatly reducing difficulty in and cost of manufacturing process. In another aspect, the word line gate structures are disposed in the substrate, and a channel controlled by the word line gate structures is perpendicular to the surface(s) of the substrate, so that the area in the horizontal direction of the substrate may be saved, and the density of the memory array unit may be improved. In still another aspect, the first isolation structure is disposed between adjacent word line gate structures adjacent to the active areas, which leads to a relatively large process window for forming the word line gate structures and the first isolation structure, and is conducive to improving production efficiency.

Furthermore, the first doped regions and the second doped regions are respectively disposed on two sides of the substrate, thus saving the area in the horizontal direction of the substrate, and thereby enabling to increase the density of the memory array unit.

Furthermore, the semiconductor structure further includes a third isolation structure, which is disposed in the active areas between adjacent word line gate structures, extends from the second surface to the first surface of the substrate, and has a depth in the substrate greater than thicknesses of the second doped regions. The second doped regions have depths greater than or equal to a distance between the word line gate structures and the second surface of the substrate, so that the third isolation structure may isolate adjacent devices and avoid leakage to occur in adjacent transistors. As a result, leakage current may be reduced, and the performance of the semiconductor structure may be improved.

Furthermore, the gate layer includes a first part and a second part disposed on the first part, and the first part and the second part are made of different materials. In addition, the first part is made of a material including polycrystalline silicon or a metal, wherein the metal includes tungsten; and the second part is made of a material including polycrystalline silicon or a metal, wherein the metal includes tungsten. The gate layer is made of not pure polycrystalline silicon or a metal, so that the performance of resistance improvement and the performance of t leakage current improvement of the gate layer are balanced.

DETAILED DESCRIPTION

As described in the BACKGROUND, the existing dynamic random access memory needs to be improved, which is analyzed and explained in combination with specific embodiments now.

Figure 1:
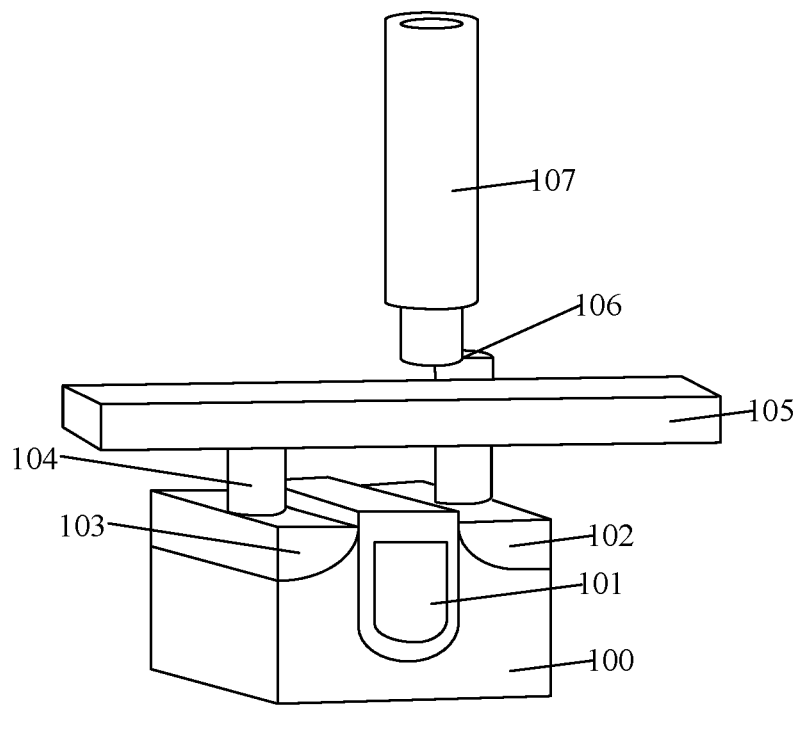
FIG. 1 is a schematic structure diagram of a semiconductor structure according to an embodiment of the present disclosure.

FIG. 1 is a schematic structure diagram of a semiconductor structure according to an embodiment of the present disclosure.

Please refer to FIG. 1, which may include a substrate 100, a word line gate structure 101, which is disposed in the substrate 100; a doped source region 103 and a doped drain region 102, which are disposed in substrate 100 on two sides of the word line gate structure 101; a bit line structure 105, which is electrically coupled with the doped source region 103 through a source plug 104; and a capacitor structure 107, which is electrically coupled with the doped drain region 102 through a capacitor plug 106.

A process for forming the semiconductor structure may include forming the doped source region 103 and the doped drain region 102 first; subsequently, forming the word line gate structure 101 in the substrate 100; then, forming the source plug 104 and the bit line structure 105; thereafter, forming the capacitor plug 106; and finally, forming the capacitor structure 107. The semiconductor structure has a channel of U shape. And, the doped source region 103 and the doped drain region 102 are on the horizontal two sides of the word line gate structure 101. The bit line structure 105 and the capacitor structure 107 are on the same side of the transistor, and are both disposed above the substrate in terms of processing technology. In addition, the capacitor plug 106 of the capacitor structure 107 needs to pass through the bit line structure 105, so that the overall process complexity is high, and there are extremely high requirements for photolithographic technology and alignment.

The embodiments of the present disclosure provide a semiconductor structure and a method for forming the same. In one aspect, the capacitor structures are disposed on the second surface of the substrate, and the bit line structures are disposed on the first surface of the substrate, thereby greatly reducing difficulty in and cost of manufacturing process. In another aspect, the word line gate structures are disposed in the substrate, and a channel controlled by the word line gate structures is perpendicular to the surface(s) of the substrate, so that the area in the horizontal direction of the substrate may be saved, and the density of the memory array unit may be improved. In still another aspect, the first isolation structure is disposed between adjacent word line gate structures adjacent to the active areas, which leads to a relatively large process window for forming the word line gate structures and the first isolation structure, and is conducive to improving production efficiency.

In order to make the above-mentioned purposes, features and beneficial effects of the present disclosure more obvious and easier to understand, the specific embodiments of the present disclosure will be illustrated in detail below in conjunction with the accompanying drawings.

FIGS. 2 to 22 are schematic intermediate sectional structure diagrams of a process for forming a semiconductor structure according to the embodiments of the present disclosure.

Figure 2:
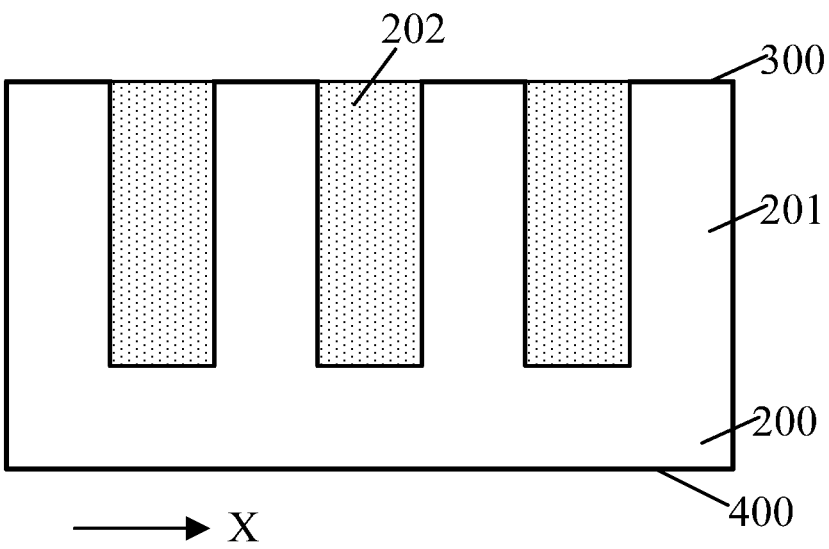
FIGS. 2 to 22 are schematic intermediate sectional structure diagrams of a process for forming a semiconductor structure according to the embodiments of the present disclosure.
Figure 3:
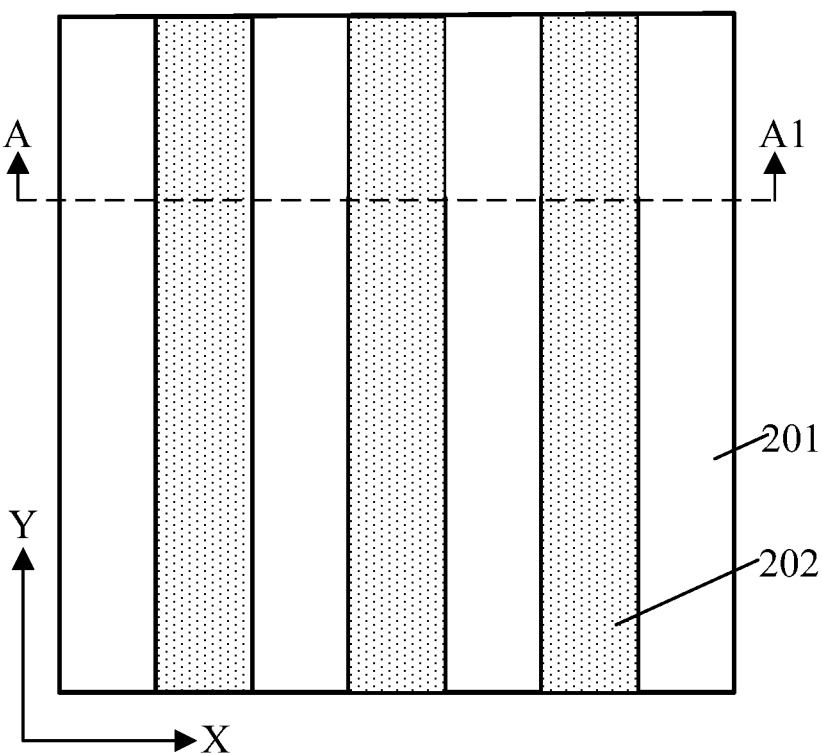

Please refer to FIGS. 2 and 3, wherein FIG. 3 is a top view of a first surface 300 of a substrate in FIG. 2, and FIG. 2 is a schematic sectional structure diagram along a direction of line AA1 in FIG. 3. A substrate 200 is provided, which may have a first surface 300 and a second surface 400 opposite to the first surface 300, and may include several discrete active areas 201 arranged in a first direction X and parallel to a second direction Y, wherein the first direction X is perpendicular to the second direction Y.

In this embodiment, the substrate 200 is made of silicon.

According to other embodiments, the substrate may be made of a material including silicon carbide, silicon-germanium, multicomponent semiconductor materials composed of III-V group elements, silicon on insulator (SOI), or germanium on insulator. Here, the multicomponent semiconductor materials composed of III-V group elements may include InP, GaAs, GaP, InAs, InSb, InGaAs, or InGaAsP.

In this embodiment, a second isolation structure 202 is disposed between adjacent active areas 201.

The second isolation structure 202 may be made of a material including a dielectric material. And, the dielectric material may include a combination of one or more selected from a group consisting of silicon oxides, silicon nitrides, silicon carbides, silicon oxycarbides, silicon oxynitrides, aluminum oxides, aluminum nitrides, silicon carbonitrides, and silicon oxycarbonitrides.

In this embodiment, the second isolation structure 202 may be made of a material including a silicon oxide or a silicon nitride.

Figure 4:
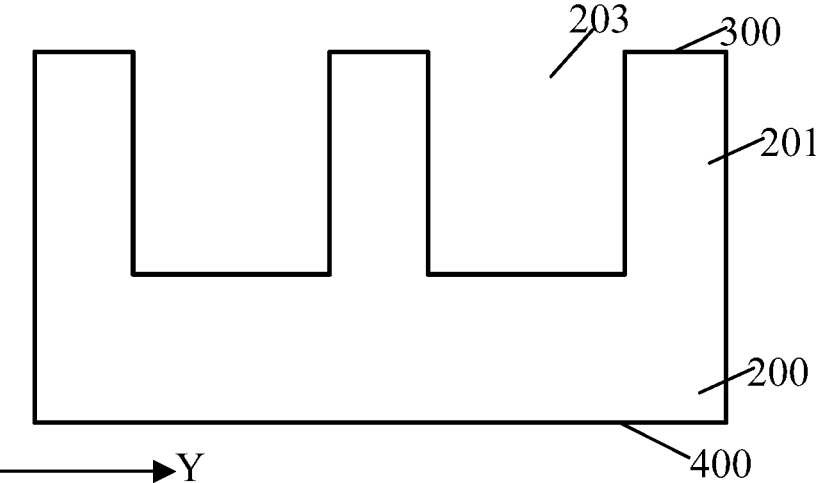
Figure 5:
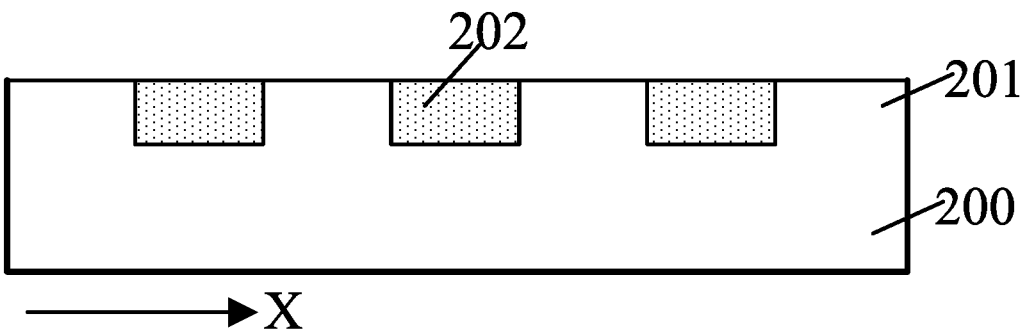
Figure 6:
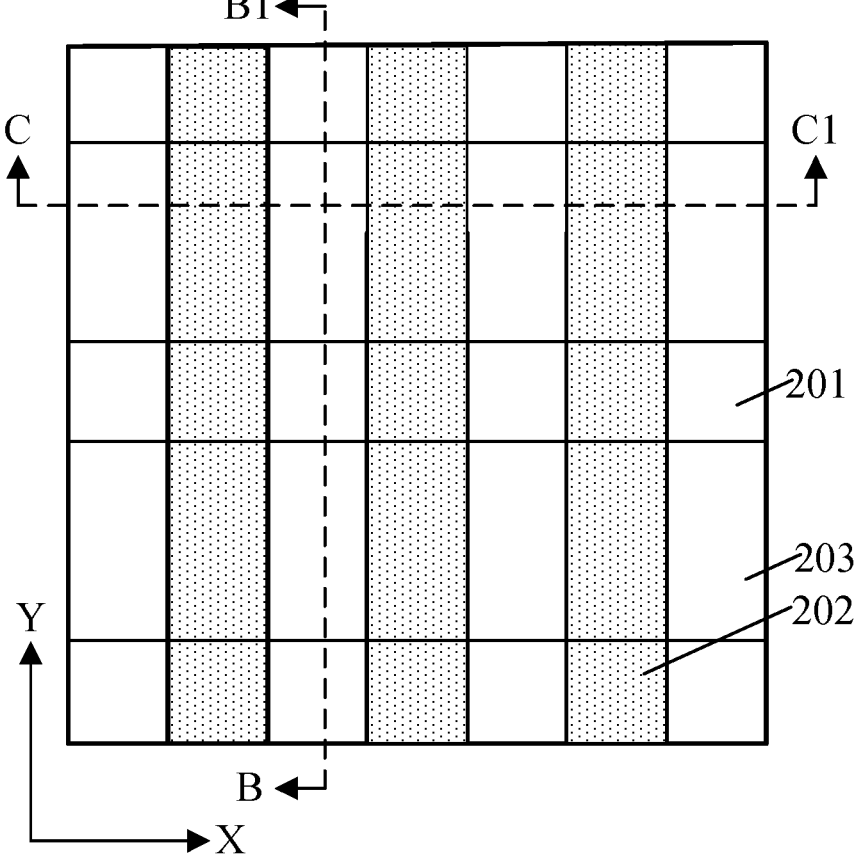

Please refer to FIGS. 4, 5 and 6, wherein FIG. 6 is a schematic top view of the first surface 300 of the substrate in FIGS. 4 and 5, FIG. 4 is a schematic sectional structure diagram along a direction of line BB1 in FIG. 6, and FIG. 5 is a schematic sectional structure diagram along a direction of line CC1 in FIG. 6. A plurality of first trenches 203 are formed in the substrate 200. The plurality of first trenches 203 extend from the first surface 300 to the second surface 400, are arranged in the second direction Y, and run through the active areas 201 along the first direction X.

A method for forming the plurality of first trenches 203 may include forming on the first surface 300 of the substrate a patterned mask layer (not shown), which exposes a part of a surface of the active areas 201; and etching the active areas 201 with the patterned mask layer as a mask, so as to form the plurality of first trenches 203 in the substrate.

In this embodiment, the plurality of first trenches 203 have a bottom plane, which is facing the second surface 400 of the substrate and higher than the bottom plane of the second isolation structure 202 facing the second surface 400 of the substrate. Thus, allowing physical space for subsequent formation of a second doped region on the second surface 400 of the substrate.

Figure 7:
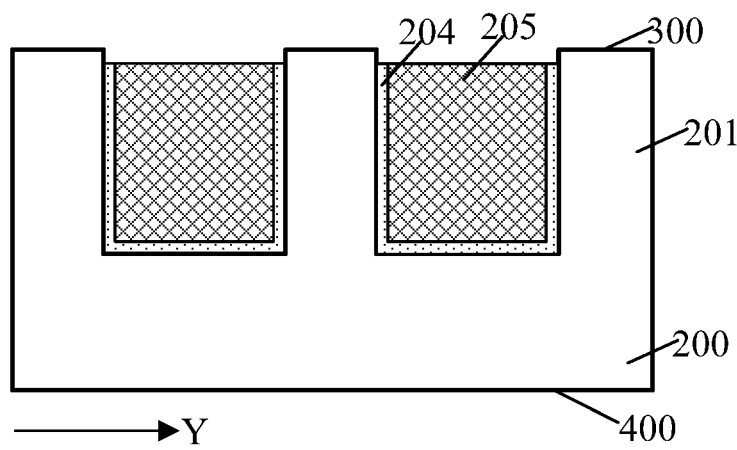
Figure 8:
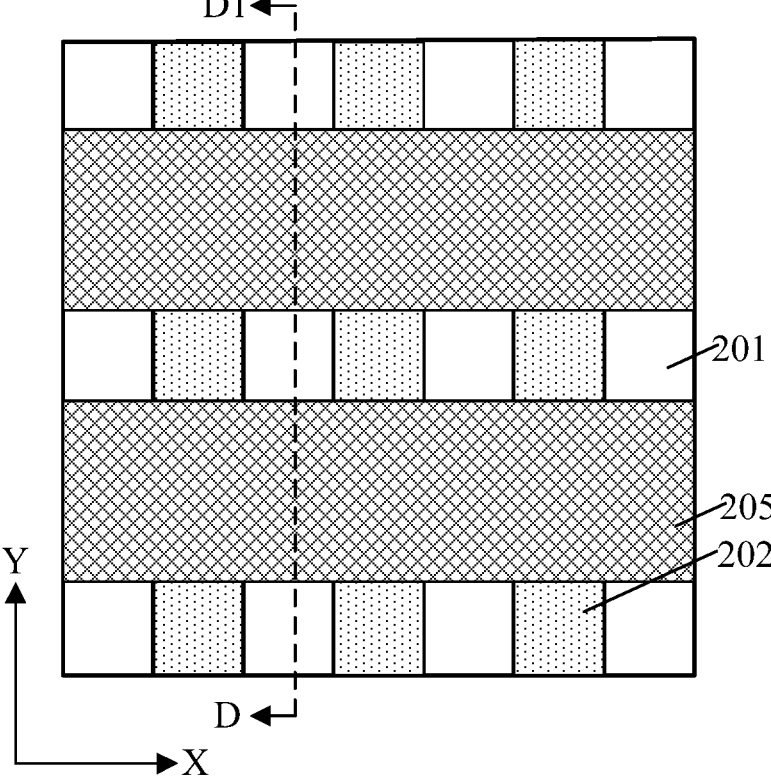

Please refer to FIGS. 7 and 8, wherein FIG. 8 is a schematic top view of the first surface 300 of the substrate in FIG. 7, and FIG. 7 is a schematic sectional structure diagram of along a direction of line DD1 in FIG. 8. An initial word line gate structure is formed in the plurality of first trenches 203.

In this embodiment, the initial word line gate structure has a top surface in a direction facing the first surface 300 of the substrate lower than a surface of the first surface 300 of the substrate.

The initial word line gate structure may include an initial gate dielectric layer 204 disposed on side wall and the bottom surfaces of the plurality of first trenches 203, and an initial gate layer 205 disposed on a surface of the initial gate dielectric layer 204.

The initial word line gate structure has a top surface facing the first surface 300 of the substrate, which is lower than a surface of the first surface 300 in the active areas 201, providing physical space for subsequent formation of a first doped region on the first surface 300 in the active areas 201.

A method for forming the initial word line gate structure may include forming a gate dielectric material layer (not shown) on side wall and bottom surfaces of the plurality of first trenches 203 and on the surface of the first surface 300 in the active areas 201; forming a gate material layer (not shown) on the gate dielectric material layer; planarizing the gate material layer and the gate dielectric material layer, until a surface of the active areas 201 is exposed, so as to form a transition initial word line gate structure; and etching back the transition initial word line gate structure, until a part of side walls of the plurality of first trenches 203 is exposed, so as to form the initial word line gate structure.

In this embodiment, the initial gate dielectric layer 204 may be made of a material including a silicon oxide or a low-K (K is less than 3.9) material; and the initial gate layer 205 may be made of a material including polycrystalline silicon.

In another embodiment, the initial gate dielectric layer may be made of a material including a material with a high dielectric constant, which may have a dielectric constant greater than 3.9, and may include aluminium oxides or hafnium oxides; and the initial gate layer may be made of a material including a metal, wherein the metal may include tungsten.

In another embodiment, the initial word line gate structure further includes an initial work function layer, which is disposed between the initial gate dielectric layer and the initial gate layer, and may be made of a material including an N-type work function material or a P-type work function material. Here, the N-type work function material may include titanium aluminum, and the P-type work function material may include titanium nitride or tantalum nitride.

According to other embodiments, the initial gate layer may include a first part disposed at bottoms of the first trenches and a second part disposed on the first part, and the first part and the second part may be made of different materials.

According to other embodiments, the initial word line gate structure may have a top surface, which is facing the first surface of the substrate and higher than the surface of the first surface of the substrate.

Figure 9:
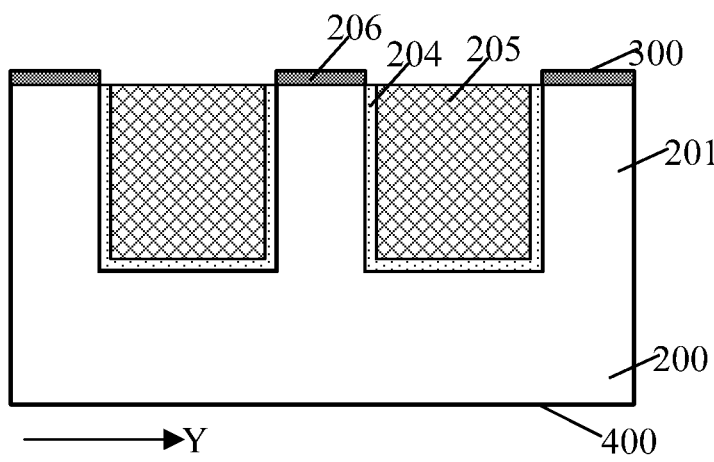
Figure 10:
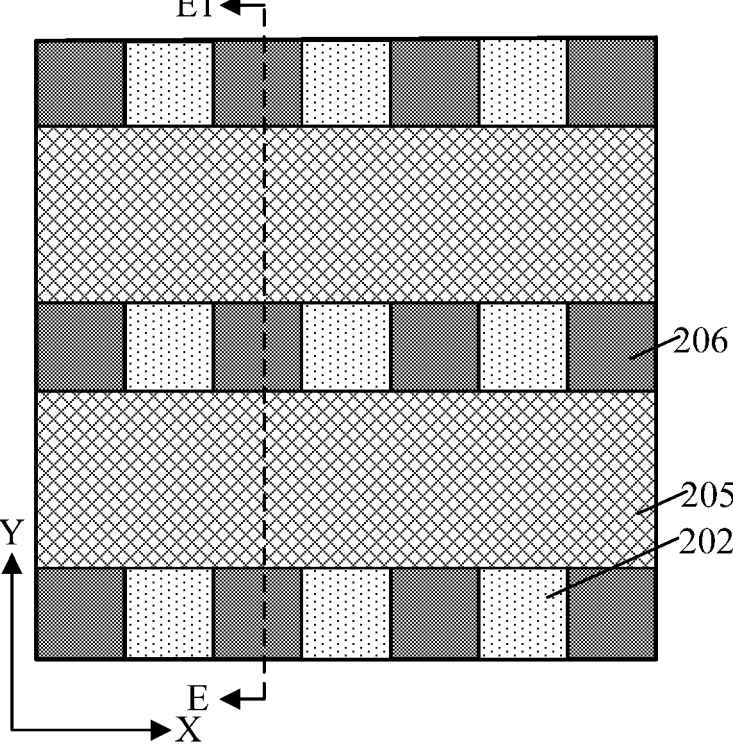

Please refer to FIGS. 9 and 10, wherein FIG. 10 is a schematic top view of the first surface 300 of the substrate in FIG. 9, and FIG. 9 is a schematic sectional structure diagram along a direction of line EE1 in FIG. 10. After the initial word line gate structure is formed, an ion is implanted into a surface of the active areas 201 exposed by the first surface 300 of the substrate 200, so as to form a first doped region 206 in the active areas 201.

The initial word line gate structure has a top surface, which is facing the first surface 300 of the substrate and higher than a bottom plane of the first doped region 206. In one aspect, it may be ensured that the first doped region 206 may be in contact with the initial gate dielectric layer 204, to ensure that the first doped region 206 is communicated with the channel and a second doped region to be formed subsequently. In another aspect, the top surface of the initial word line gate structure is facing the first surface 300 of the substrate and lower than the surface of the first surface 300 of the substrate 200, so that a channel to be formed subsequently in the active areas 201 by the word line gate structures will less excessively overlap with the first doped region 206 and be affected. In still another aspect, the process window for the subsequent formation of a bit line structure on the first surface 300 of the substrate 200 may be increased, and production yield may be improved.

The first doped region 206 may have a doped ion of N-type or P-type. Here, the doped ion of N-type may include phosphonium ions, arsenic ions, or antimony ions; and the doped ion of P-type may include boron ions, boron fluoride ions, or indium ions.

Figure 11:
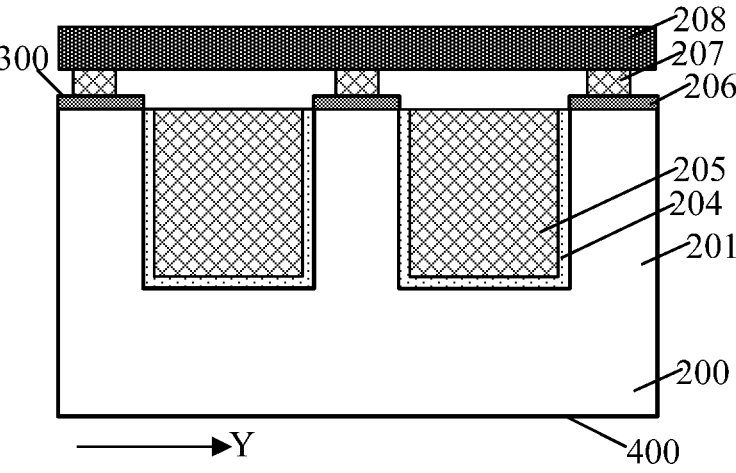
Figure 12:
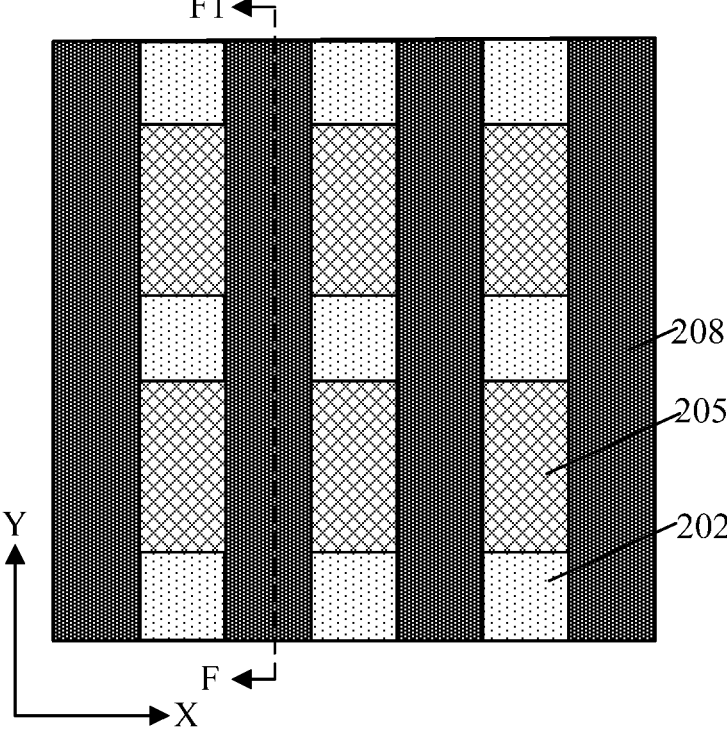

Please refer to FIGS. 11 and 12, wherein FIG. 12 is a schematic top view of the first surface 300 of the substrate in FIG. 11, and FIG. 11 is a schematic sectional structure diagram along a direction of line FF1 in FIG. 12. A plurality of bit line structures 208 are formed on the first surface 300 of each of the active areas 201. The plurality of bit line structures 208 are arranged in the first direction X, and parallel to the second direction Y.

Each of the plurality of bit line structures 208 is electrically coupled with a row of the first doped regions 206 arranged in the second direction Y, respectively.

In this embodiment, a bit line plug 207 is further formed on the first doped regions 206. And, the bit line plug 207 electrically couples the bit line structures 208 with the first doped regions 206.

A method for forming the bit line structures 208 and the bit line plug 207 may include forming a first dielectric layer 209 on the first surface 300 in the active areas 201; forming a third trench (not shown) in the first dielectric layer; forming in the third trench an opening (not shown), which exposes a part of a surface of the first doped regions 206; forming a bit line plug 207 in the opening, and forming the bit line structures 208 in the third trench.

In the method for forming the bit line structures 208 and the bit line plug 207, the third trench is formed in the first dielectric layer 209, the opening is formed in the third trench, the bit line plug is formed in the opening, and then, the bit line structures are formed in the third trench. The aforementioned process window is relatively large, the process is relatively simple, production efficiency may be improved.

The bit line structures 208 may include a barrier layer (not shown) disposed on side wall and bottom surfaces of the third trench, and a bit line layer (not shown) disposed on the barrier layer.

The barrier layer may be made of a material including a metal nitride; and the bit line layer may be made of a material including a metal or a metal nitride. Here, the metal may include a combination of one or more selected from a group consisting of copper, aluminum, tungsten, cobalt, nickel, and tantalum; and the metal nitride may include a combination of one or more selected from a group consisting of tantalum nitride and titanium nitride.

In another embodiment, the bit line plug may be not formed, and the bit line structures may be electrically coupled with the first doped regions in direct contact.

Next, after the plurality of bit line structures 208 are formed, a part of the substrate and a part of the initial word line gate structure are removed to form in the substrate a second trench, which extends from the second surface of the substrate to the first surface of the substrate and runs through the initial word line gate structure, so that the initial word line gate structure forms discrete word line gate structures; and a first isolation structure is formed in the second trench, and the word line gate structures are disposed on two sides of the first isolation structure. Please refer to FIGS. 13 to 18 for the process for forming the first isolation structure.

Figure 13:
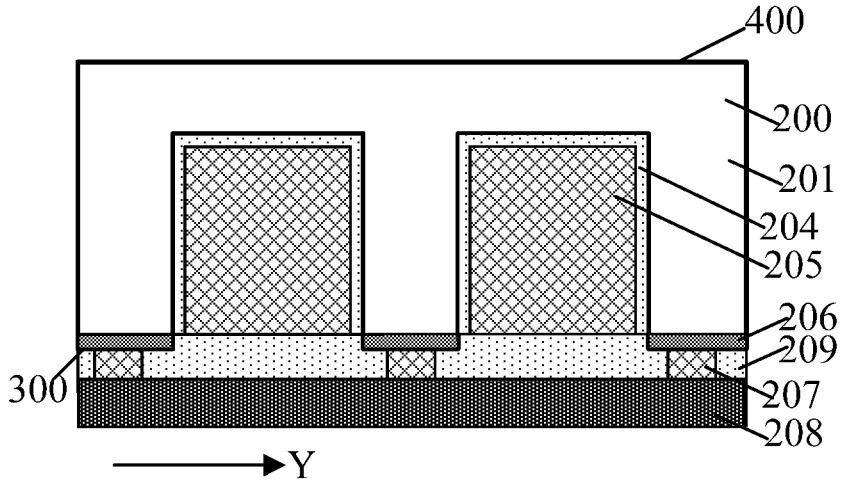
Figure 14:
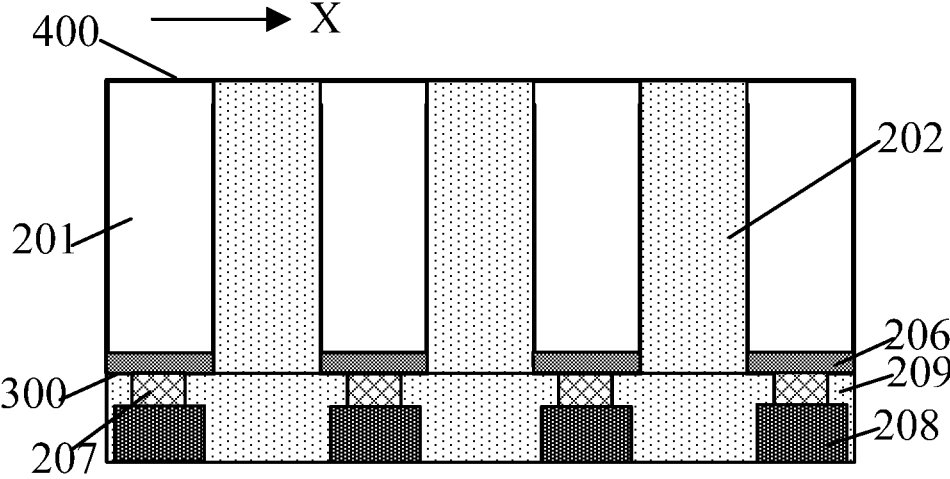
Figure 15:
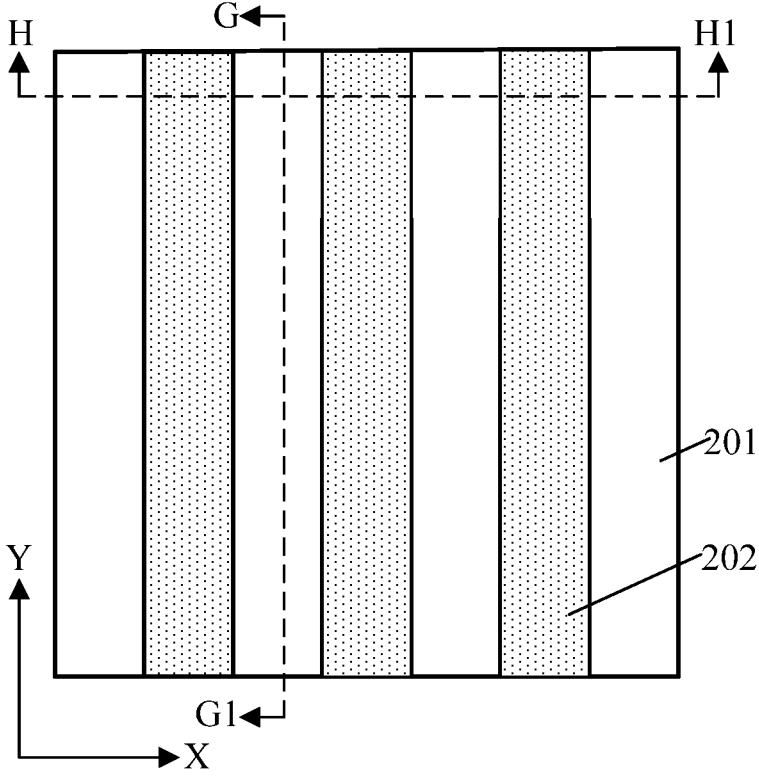

Please refer to FIGS. 13, 14 and 15, wherein FIG. 15 is a schematic top view of the second surface 400 of the substrate in FIGS. 13 and 14, FIG. 13 is a schematic sectional structure diagram along a direction of line GG1 in FIG. 15, and FIG. 14 is a schematic sectional structure diagram along a direction of line HH1 in FIG. 15. The second surface 400 of the substrate is thinned, until a surface of the second isolation structure 202 is exposed.

A method for thinning the substrate from the second surface 400 may include providing a base (not shown), which has a surface bonded to a surface of the first dielectric layer 209; and reversing the base and the substrate, and thinning the substrate from the second surface 400, until the surface of the second isolation structure 202 is exposed.

A process for thinning the substrate from the second surface 400 may include a chemico-mechanical polishing process.

Figure 16:
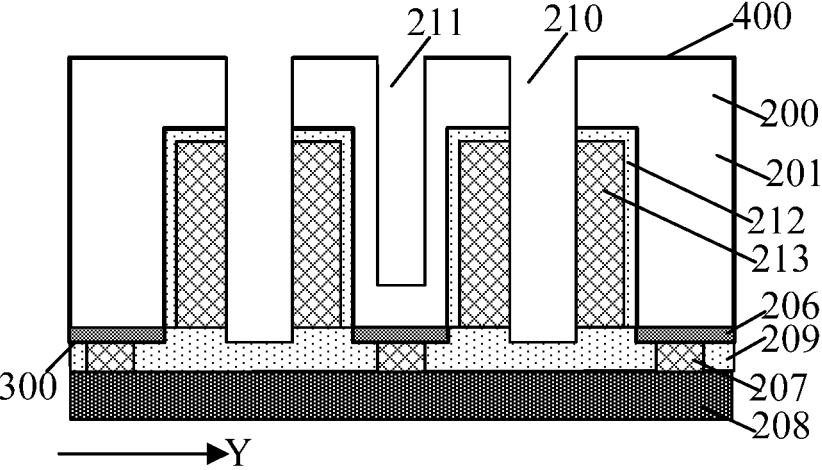

Please refer to FIG. 16, which is a schematic structure diagram based on FIG. 13. A part of thinned substrate 200 and a part of the initial word line gate structure are removed to form the second trench 210 and the word line gate structures, wherein the word line gate structures are disposed one two sides of the second trench 210.

The word line gate structures may include a gate dielectric layer 212 and a gate layer 213 disposed on the gate dielectric layer 212.

In this embodiment, while removing a part of thinned substrate and a part of the initial word line gate structure, a part of the active areas 201 between adjacent first trenches is removed to form in the substrate a fifth trench 211, which extends from the second surface 400 to the first surface 300 of the substrate, and has a depth in the substrate 200 greater than the thickness of a second doped region to be formed subsequently.

In this embodiment, the word line gate structures may include a gate dielectric layer 212 and a gate layer 213 disposed on the gate dielectric layer 212.

The fifth trench 211 has a depth in the substrate 200 greater than the thickness of the second doped region to be formed subsequently, thereby, it is ensured that a third isolation structure to be formed subsequently in the fifth trench 211 may isolate adjacent transistors.

Figure 17:
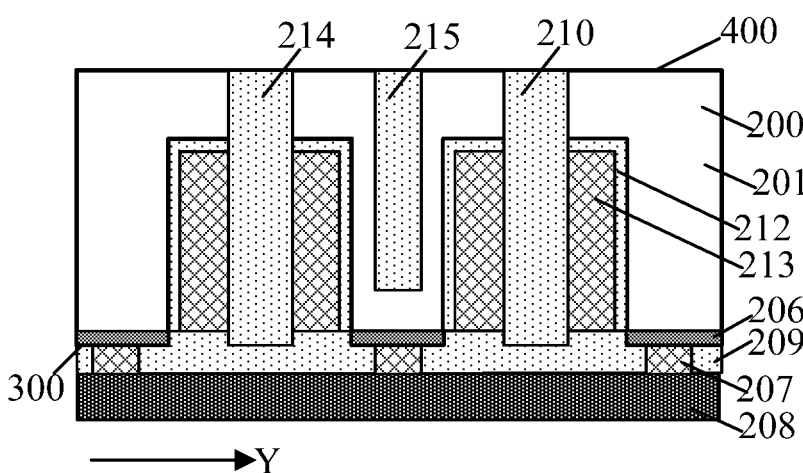
Figure 18:
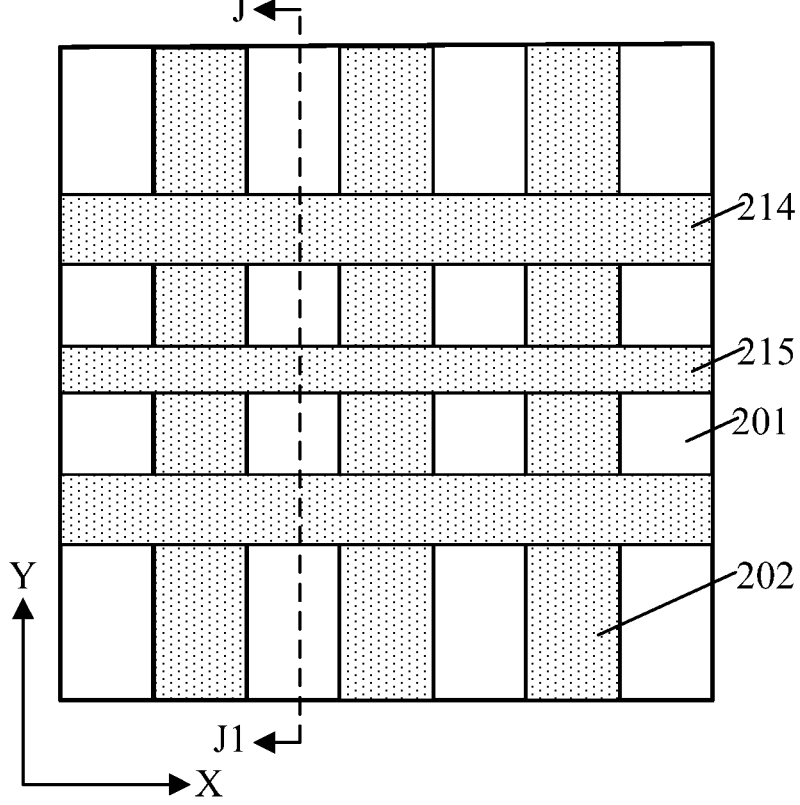

Please refer to FIGS. 17 and 18, wherein FIG. 18 is a schematic top view of the second surface 400 of the substrate in FIG. 17, and FIG. 17 is a schematic sectional structure diagram along a direction of line JJ1 in FIG. 18. The first isolation structure 214 is formed in the second trench 210, and the word line gate structures are disposed on two sides of the first isolation structure 214.

While forming the first isolation structure 214 in the second trench 210, a third isolation structure 215 is formed in the fifth trench 211.

The third isolation structure 215 has a depth in the substrate 200 greater than the thickness of the second doped region to be formed subsequently. Thereby, the third isolation structure 215 may isolate adjacent devices to avoid leakage to occur in adjacent transistors. As a result, leakage current may be reduced, and the performance of the semiconductor structure may be improved.

Figure 19:
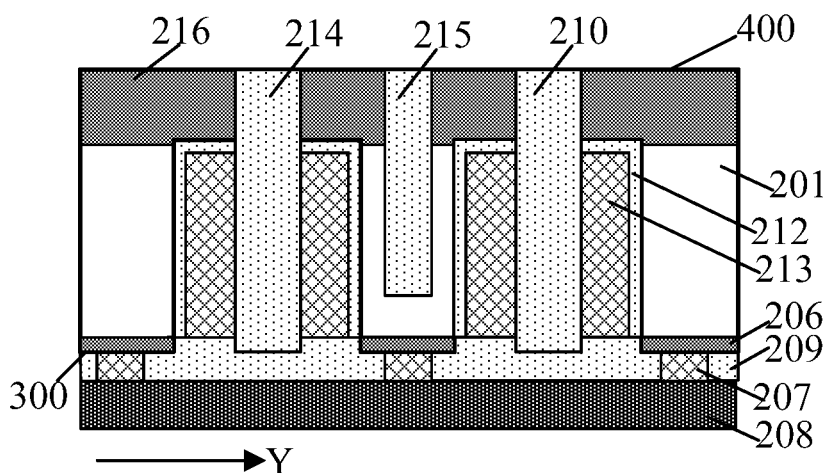
Figure 20:
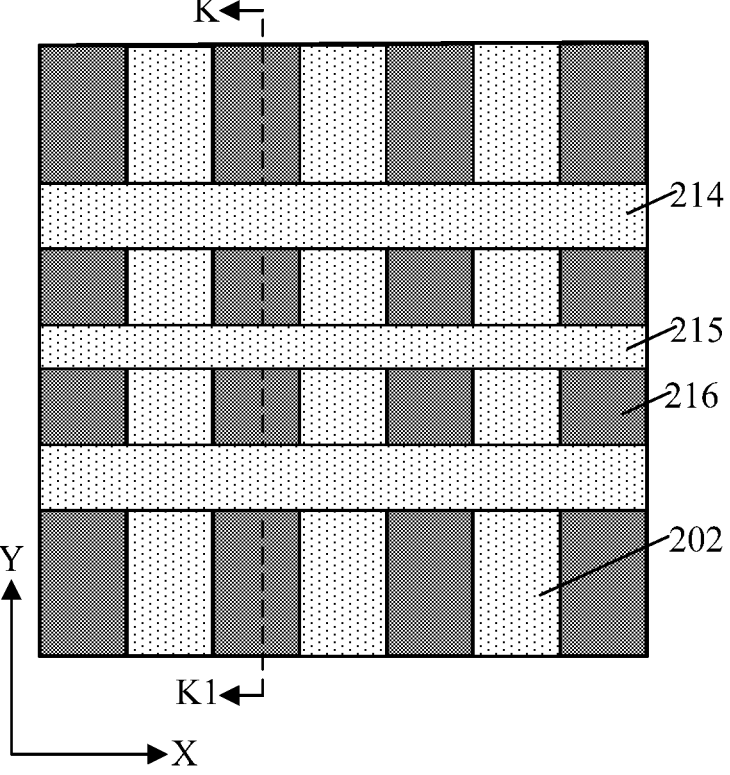

Please refer to FIGS. 19 and 20, wherein FIG. 20 is a schematic top view of the second surface 400 of the substrate in FIG. 19, and FIG. 19 is a schematic sectional structure diagram along a direction of line KK1 in FIG. 20. An ion is implanted into the second surface 400 of the thinned substrate to form a second doped region 216 in the active areas 201.

The first doped regions 206 and the second doped region 216 are respectively disposed on two surfaces of the substrate 200, so that the area in the horizontal direction of the substrate 200 is saved, thereby the density of the memory array unit may be increased.

The second doped region 216 has a depth greater than or equal to the distance between the word line gate structures and the second surface 400 of the substrate 200, thereby, it is ensured that the second doped region 216 may be in contact with the gate dielectric layer 212, so as to ensure that the second doped region 216 is communicated with the channel and the first doped regions 206.

The second doped region 216 may have a doped ion of N-type or P-type. Here, the doped ion of N-type may include phosphonium ions, arsenic ions, or antimony ions; and the doped ion of P-type may include boron ions, boron fluoride ions, or indium ions.

In this embodiment, the doped ion in the second doped region 216 may have a conduction type same as the conduction type of the doped ion in the first doped region 206.

Figure 21:
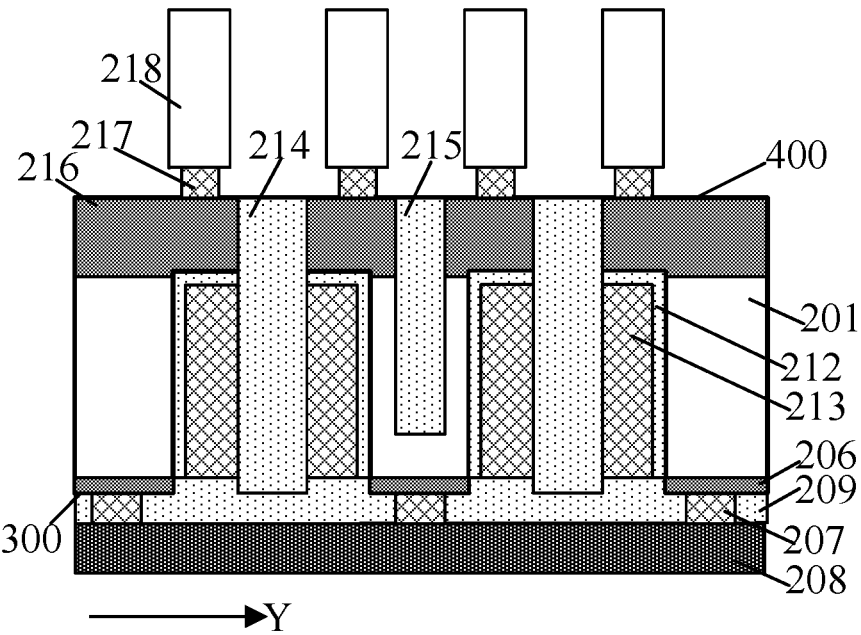
Figure 22:
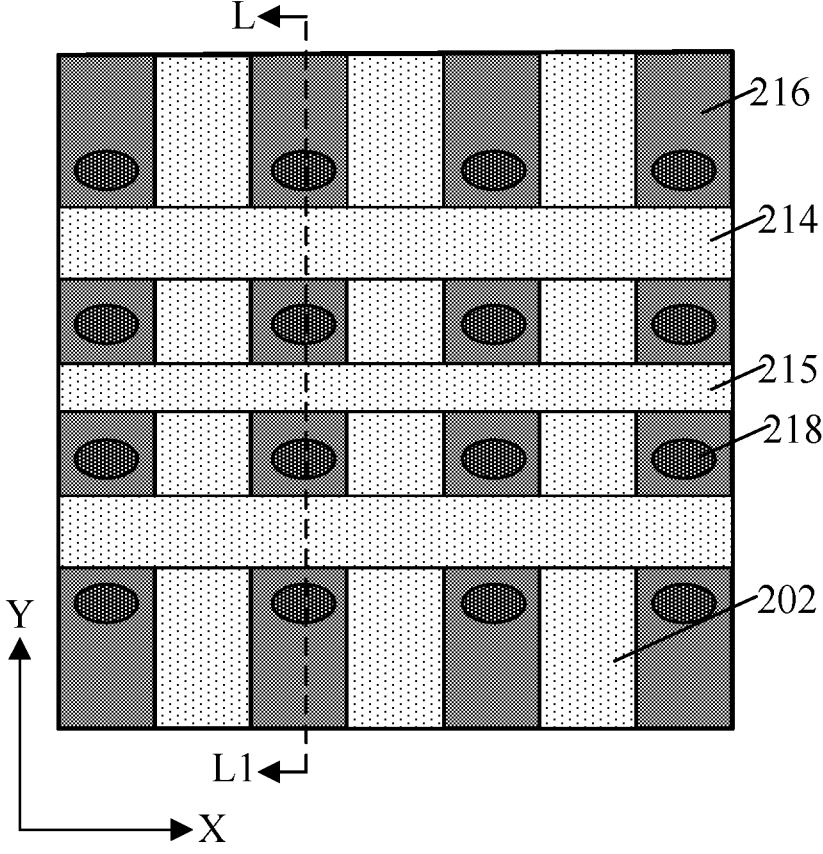

Please refer to FIGS. 21 and 22, wherein FIG. 22 is a schematic top view of the second surface 400 of the substrate in FIG. 21, and FIG. 21 is a schematic sectional structure diagram along a direction of line LL1 in FIG. 22. A plurality of capacitor structures 218 are formed on the second surface 400 of the substrate 200. And, the plurality of capacitor structures are electrically coupled with the active areas 201.

Each of the plurality of capacitor structures 218 is electrically coupled with a second doped region 216 in one of the active areas 201, respectively. The plurality of capacitor structures 218 may have projection on the second surface 400 of the substrate, which is overlapping with at least a part of the second doped region 216, to ensure that the plurality of capacitor structures 218 are electrically coupled with the second doped region 216.

In this embodiment, a capacitor plug 217 is formed on the second doped region 216. And, the capacitor plug 217 electrically couples the capacitor structures 218 with the second doped region 216.

A method for forming the capacitor plug 217 and the plurality of capacitor structures 218 may include forming in the active areas on the second surface 400 of the substrate and on the second isolation structure 202 a second dielectric layer (not shown), which has a plurality of fourth trenches (not shown) therein; forming in the fourth trenches an opening (not shown), which exposes a surface of the second doped region 216; forming a capacitor plug 217 in the opening, and forming the plurality of capacitor structures 218 in the fourth trenches.

The plurality of capacitor structures 218 may include a first electrode layer (not shown), a second electrode layer (not shown), and a dielectric layer (not shown) disposed between the first electrode layer and the second electrode layer.

The dielectric layer may have a shape including a planar shape or an "U" shape.

When the dielectric layer is of the planar shape, the first electrode layer has a flat surface, and the second electrode layer has a flat surface.

When the dielectric layer is of the "U" shape, the first electrode layer has an uneven surface, and the second electrode layer has an uneven surface.

The first electrode layer may be made of a material including a metal or a metal nitride; and the second electrode layer may be made of a material including a metal or a metal nitride. Here, the metal may include a combination of one or more selected from a group consisting of copper, aluminum, tungsten, cobalt, nickel, and tantalum; and the metal nitride may include a combination of one or more selected from a group consisting of tantalum nitride and titanium nitride.

The capacitor plug 217 may be made of a material including a metal or a metal nitride. Here, the metal may include a combination of one or more selected from a group consisting of copper, aluminum, tungsten, cobalt, nickel, and tantalum; and the metal nitride may include a combination of one or more selected from a group consisting of tantalum nitride and titanium nitride.

In another embodiment, the capacitance plug may be not formed, and the plurality of capacitor structures are electrically coupled with the first doped regions in direct contact.

A method for forming the plurality of capacitor structures may include forming a second dielectric layer in the active areas on the second surface of the substrate and on the second isolation structure, wherein the second dielectric layer has a plurality of fourth trenches therein, and the plurality of fourth trenches expose a surface of the second doped region; and forming the plurality of capacitor structures in the plurality of fourth trenches.

So far, in the formed semiconductor structure, in one aspect, the plurality of capacitor structures 218 are disposed on the second surface 400 of the substrate, and the plurality of bit line structures 208 are disposed on the first surface 300 of the substrate, thereby greatly reducing difficulty in and cost of manufacturing process. In another aspect, the word line gate structures are disposed in the substrate, and a channel controlled by the word line gate structures is perpendicular to the surface(s) of the substrate, so that the area in the horizontal direction of the substrate may be saved, and the density of the memory array unit may be improved. In still another aspect, the first isolation structure 214 is disposed between adjacent word line gate structures adjacent to the active areas, which leads to a relatively large process window for forming the word line gate structures and the first isolation structure 214, and is conducive to improving production efficiency.

Please continue to refer to FIGS. 21 and 22, correspondingly, the embodiments of the present disclosure further provide a semiconductor structure, which may include:

- a substrate 200, which may have a first surface 300 and a second surface 400 opposite to the first surface 300, and may include several discrete active areas 201 arranged in a first direction X and parallel to a second direction Y, wherein the first direction X is perpendicular to the second direction Y;
- a plurality of word line gate structures, which are disposed in and adjacent to the active areas 201, extend from the first surface 300 to the second surface 400, are arranged in the second direction Y, and run through the active areas 201 along the first direction X;
- a first isolation structure 214, which is disposed in the substrate 200 and extends from the second surface 400 of the substrate to the first surface 300 of the substrate, wherein the word line gate structures are disposed on two sides of the first isolation structure 214;
- a plurality of bit line structures 208, which are disposed on the first surface of the substrate, electrically coupled with the active areas 201, arranged in the first direction X, and parallel to the second direction Y;
- a plurality of capacitor structures 218, which are disposed on the second surface of the substrate and electrically coupled with the active areas 201.

In this embodiment, the semiconductor structure may further include a plurality of first doped regions 206, which are disposed in the active areas 201 on the first surface 300 of the substrate 200, and each of the plurality of bit line structures 208 is electrically coupled with a row of first doped regions 206 arranged in the second direction Y, respectively.

In this embodiment, the semiconductor structure may further include a plurality of second doped regions 216, which are disposed in the active areas 201 on the second surface 400 of the substrate 200, and each of the plurality of capacitor structures 218 is electrically coupled with the second doped region(s) 216 in one of the active areas 201, respectively.

In this embodiment, the plurality of capacitor structures 218 have projection on the second surface 400 of the substrate 200, which is overlapping with at least part of the second doped regions 216.

In this embodiment, a second isolation structure is disposed between adjacent active areas 201, and the second surface 400 of the substrate exposes the second isolation structure.

In this embodiment, the semiconductor structure may further include a third isolation structure 215, which is disposed in the active areas 201 between adjacent word line gate structures, extends from the second surface 400 to the first surface 300 of the substrate, and has a depth in the substrate greater than thicknesses of the second doped regions 216.

In this embodiment, the plurality of word line gate structures may include a gate dielectric layer 212 and a gate layer 213 disposed on a surface of the gate dielectric layer 212. In this embodiment, the gate layer 213 may be made of a material including polycrystalline silicon or a metal, wherein the metal may include tungsten.

Figure 23:
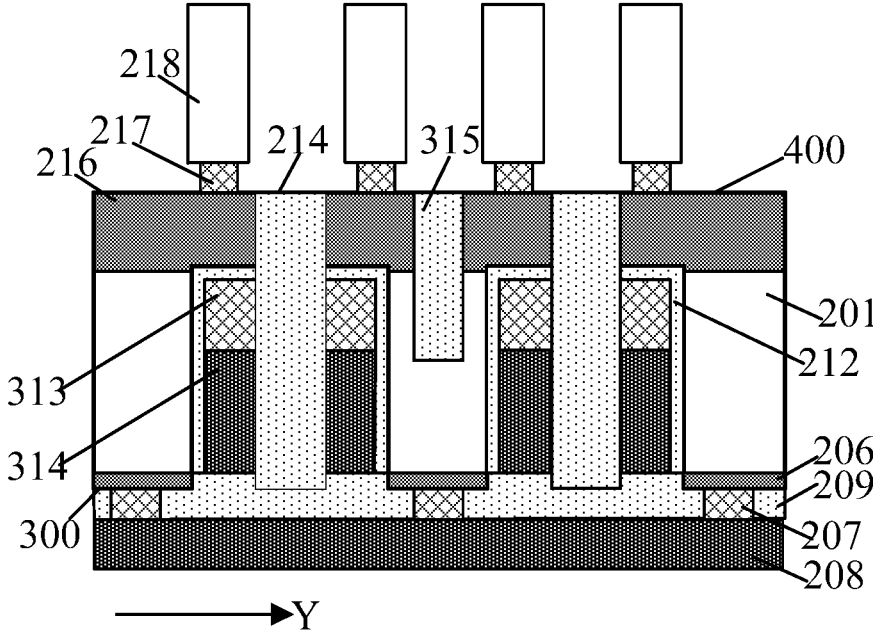
FIG. 23 is a schematic sectional structure diagram of a semiconductor structure according to another embodiment of the present disclosure.

FIG. 23 is a schematic sectional structure diagram of a semiconductor structure according to another embodiment of the present disclosure.

Please refer to FIG. 23, which shows a structure having the following differences from the structure in FIGS. 22 and 21.

The word line gate structures may include a gate dielectric layer disposed on side wall and bottom surfaces of the first trenches, and a gate layer disposed on a surface of the gate dielectric layer.

The gate layer may include a first part 313 disposed at the bottom of the first trenches and a second part 314 disposed on the first part 313, and the first part 313 and the second part 314 are made of different materials.

The first part 313 may be made of a material including polycrystalline silicon or a metal, wherein the metal may include tungsten; and the second part 314 may be made of a material including polycrystalline silicon or a metal, wherein the metal may include tungsten.

The gate layer is made of not pure polycrystalline silicon or a metal, so that the performance of resistance improvement and the performance of leakage current improvement of the gate layer are balanced, avoiding relatively large resistance of the gate layer when the gate layer is made of polycrystalline silicon, and further avoiding leakage easily to occur when the gate layer is made of a metal, thereby the performance of the semiconductor structure is improved.

In this embodiment, the first part 313 may be made of a material including polycrystalline silicon; and the second part 314 may be made of a material including tungsten.

In another embodiment, the first part may be made of a material including tungsten; and the second part may be made of a material including polycrystalline silicon.

Although the present disclosure is disclosed as above, the present disclosure is not limited hereto. Various changes and modifications may be made by those skilled in the art, without departing from the spirit and scope of the present disclosure. Thus, the scope of protection of the present disclosure shall be subject to the scope defined by the claims.

What is claimed is:

1. A semiconductor structure, comprising:

a substrate, which has a first surface and a second surface opposite to the first surface, and comprises several discrete active areas arranged in a first direction and parallel to a second direction, wherein the first direction is perpendicular to the second direction;

a plurality of word line gate structures, which are disposed in and adjacent to the active areas, extend from the first surface to the second surface, are arranged in the second direction, and run through the active areas along the first direction;

a first isolation structure, which is disposed in the substrate and extends from the second surface of the substrate to the first surface of the substrate, wherein the plurality of word line gate structures are disposed on two sides of the first isolation structure;

a plurality of bit line structures, which are disposed on the first surface of the substrate, electrically coupled with the active areas, arranged in the first direction, and parallel to the second direction; and a plurality of capacitor structures, which are disposed on the second surface of the substrate and electrically coupled with the active areas.

2. The semiconductor structure according to claim 1, further comprising a plurality of first doped regions, which are disposed in the active areas on the first surface of the substrate, and each of the plurality of bit line structures is electrically coupled with a row of first doped regions arranged in the second direction, respectively.

3. The semiconductor structure according to claim 1, further comprising a plurality of second doped regions, which are disposed in the active areas on the second surface of the substrate, and have depths greater than or equal to a distance between the plurality of word line gate structures and the second surface of the substrate; and each of the plurality of capacitor structures is electrically coupled with the second doped region(s) in one of the active areas, respectively.

4. The semiconductor structure according to claim 1, wherein a second isolation structure is disposed between adjacent active areas, and the second surface of the substrate exposes the second isolation structure.

5. The semiconductor structure according to claim 3, further comprising a third isolation structure, which is disposed in the active areas between adjacent word line gate structures, extends from the second surface to the first surface of the substrate, and has a depth in the substrate greater than thicknesses of the second doped regions.

6. The semiconductor structure according to claim 1, wherein the plurality of word line gate structures comprise a gate dielectric layer and a gate layer disposed on a surface of the gate dielectric layer.

7. The semiconductor structure according to claim 6, wherein the gate layer comprises a first part and a second part disposed on the first part, and the first part and the second part are made of different materials.

8. The semiconductor structure according to claim 7, wherein the first part is made of a material comprising polycrystalline silicon or a metal, wherein the metal comprises tungsten; and the second part is made of a material comprising polycrystalline silicon or a metal, wherein the metal comprises tungsten.

9. A method for forming a semiconductor structure, comprising:

providing a substrate, which has a first surface and a second surface opposite to the first surface, and comprises several discrete active areas arranged in a first direction and parallel to a second direction, wherein the first direction is perpendicular to the second direction;

forming in the substrate a plurality of first trenches, which extend from the first surface to the second surface, arranged in the second direction, and run through the active areas along the first direction;

forming an initial word line gate structure in the first trenches;

after the initial word line gate structure is formed, forming on the first surface of the substrate a plurality of bit line structures, which are arranged in the first direction and parallel to the second direction;

after the plurality of bit line structures are formed, removing a part of the substrate and a part of the initial word line gate structure, so as to form in the substrate a second trench that extends from the second surface of the substrate to the first surface of the substrate and runs through the initial word line gate structure, so that the initial word line gate structure forms discrete word line gate structures;

forming a first isolation structure in the second trench, wherein the word line gate structures are disposed on two sides of the first isolation structure; and after the first isolation structure is formed, forming on the second surface of the substrate a plurality of capacitor structures, which are electrically coupled with the active areas.

10. The method for forming a semiconductor structure according to claim 9, wherein a second isolation structure is disposed between adjacent active areas, and a method for removing a part of the substrate and a part of the initial word line gate structure comprises thinning the substrate from the second surface, until a surface of the second isolation structure is exposed; and removing a part of thinned substrate and a part of the initial word line gate structure, to form the second trench and the word line gate structures.

11. The method for forming a semiconductor structure according to claim 9, wherein a method for forming the plurality of bit line structures comprises forming a first dielectric layer on the initial word line gate structure and the first surface of the substrate; forming in the first dielectric layer a third trench, which exposes a partial surface of the active areas; and forming the plurality of bit line structures in the third trench.

12. The method for forming a semiconductor structure according to claim 9, before forming the plurality of bit line structures on the first surface of the substrate, further comprising implanting an ion into a surface of the active areas exposed by the first surface of the substrate, so as to form a plurality of first doped regions in the active areas; and electrically coupling each of the bit line structures with a row of first doped regions arranged in the second direction.

13. The method for forming a semiconductor structure according to claim 12, wherein the word line gate structures have a top surface, which is facing the first surface of the substrate and higher than the bottom plane of the first doped regions facing the first surface of the substrate.

14. The method for forming a semiconductor structure according to claim 10, wherein a method for forming the plurality of capacitor structures comprises forming on the active areas and the second isolation structure on the second surface of the substrate a second dielectric layer, which has a plurality of fourth trenches therein exposing a surface of the active areas; and forming the plurality of capacitor structures in the plurality of fourth trenches.

15. The method for forming a semiconductor structure according to claim 14, wherein after the first isolation structure is formed in the second trench and before the plurality of capacitor structures are formed on the second surface of the substrate, further comprising implanting an ion into the second surface of the thinned substrate, so as to form a plurality of second doped regions in the active areas; and electrically coupling each of the plurality of capacitor structures with the second doped region(s) in one of the active areas, respectively.

16. The method for forming a semiconductor structure according to claim 15, while removing a part of the thinned substrate and a part of the initial word line gate structure, further comprising removing a part of the active areas between adjacent first trenches, so as to form in the substrate a fifth trench, which extends from the second surface to the first surface of the substrate and has a depth in the substrate greater than thicknesses of the second doped regions.

17. The method for forming a semiconductor structure according to claim 16, while forming the first isolation structure in the second trench, further comprising forming a third isolation structure in the fifth trench.

18. The method for forming a semiconductor structure according to claim 17, wherein the initial word line gate structure comprises a gate dielectric layer disposed on side wall and bottom surfaces of the first trenches, and a gate layer disposed on a surface of the gate dielectric layer.

19. The method for forming a semiconductor structure according to claim 18, wherein the gate layer comprises a first part disposed at the bottom of the first trenches and a second part disposed on the first part, and the first part and the second part are made of different materials.

20. The method for forming a semiconductor structure according to claim 19, wherein the first part is made of a material comprising polycrystalline silicon or a metal, wherein the metal comprises tungsten; and the second part is made of a material comprising polycrystalline silicon or a metal, wherein the metal comprises tungsten.

* * * * *